United States Patent
Wang et al.

(10) Patent No.: US 9,721,841 B1
(45) Date of Patent: Aug. 1, 2017

(54) ELECTRONIC CIRCUIT OF FIN FET AND METHOF FOR FABRICATING THE ELECTRONIC CIRCUIT

(71) Applicant: United Microelectronics Corp., Hsinchu (TW)

(72) Inventors: Jun-Jie Wang, Changhua County (TW); Yu-Lin Wang, Taipei (TW); Ching-Wen Hung, Tainan (TW); En-Chiuan Liou, Tainan (TW); Chih-Sen Huang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 18 days.

(21) Appl. No.: 15/140,019

(22) Filed: Apr. 27, 2016

(51) Int. Cl.
*H01L 21/82* (2006.01)
*H01L 21/8234* (2006.01)
*H01L 27/11* (2006.01)
*H01L 27/088* (2006.01)
*H01L 29/49* (2006.01)
*H01L 29/06* (2006.01)

(52) U.S. Cl.
CPC ........ *H01L 21/823456* (2013.01); *H01L 21/823431* (2013.01); *H01L 21/823468* (2013.01); *H01L 27/0886* (2013.01); *H01L 27/1104* (2013.01); *H01L 29/0649* (2013.01); *H01L 29/4916* (2013.01)

(58) Field of Classification Search
CPC ..... H01L 29/06; H01L 29/0696; H01L 29/42; H01L 29/4238; H01L 29/66; H01L 29/66795; H01L 29/78; H01L 29/785; H01L 21/82; H01L 21/823; H01L 21/8234; H01L 21/82345; H01L 21/82343; H01L 21/823456; H01L 21/823431; H01L 21/823468
USPC ........................................................ 257/401
See application file for complete search history.

(56) References Cited

U.S. PATENT DOCUMENTS

| | | | |
|---|---|---|---|
| 7,910,959 B2 | 3/2011 | Becker et al. | |
| 7,983,072 B2 | 7/2011 | Inaba | |
| 2013/0058155 A1 | 3/2013 | Callen et al. | |
| 2016/0133632 A1* | 5/2016 | Park | H01L 29/785 257/369 |
| 2016/0172351 A1* | 6/2016 | Shimbo | H01L 27/0207 257/401 |

OTHER PUBLICATIONS

Jun Jie Wang et al., "Layout Pattern for SRAM and Manufacturing Methods Thereof", Unpublished U.S. Appl. No. 15/088,122, filed Apr. 1, 2016.

* cited by examiner

*Primary Examiner* — Monica D Harrison
(74) *Attorney, Agent, or Firm* — J.C. Patents

(57) ABSTRACT

An electronic circuit includes a plurality of fin lines on a substrate and a plurality of gate lines with a first line width, crossing over the fin lines. The gate lines are parallel and have a plurality of discontinuous regions forming as a plurality of slots. A region of any one of the gate lines adjacent to an unbalance of the slots has a second line width smaller than the first line width.

20 Claims, 6 Drawing Sheets

ELECTRONIC CIRCUIT OF FIN FET AND METHOF FOR FABRICATING THE ELECTRONIC CIRCUIT

BACKGROUND OF THE INVENTION

1. Field of the Invention

The present invention generally relates to a semiconductor device, in particular, to an electronic circuit of fin field effect transistor (FET) and method for fabricating the electronic circuit of fin FET.

2. Description of Related Art

As the request to reduce the size of electronic device and increase the operation speed of electronic device, the size of the semiconductor device such as FET needs to be accordingly reduced. When size of the FET is greatly reduced, the conventional FET with polysilicon gate cannot be adapted well. So, the structure of FET in 2D structure is no longer suitable for use.

In the technologies under development, a type of fin FET has been proposed. The fin FET is in 3D structure, in which the source/drain region has been raised up from the substrate, like a fin in structure. The gate can be fondled as a gate line, crossing over the fin to serve as the gate structure for each FET and also the connection part between the related FET.

An electronic circuit is usually made from multiple fin FETs, which in view of locations can be treated as a fin FET array. In the conventional fin FET array, the polysilicon lines, as the gate lines, have the same line width without concerning the unbalance stress due to the poly slot (discontinuous part), which is deposited with oxide later.

It has been found and investigated in the invention that at least an issue of circuit short for the gate line may occur when the later conductive structure is formed over the slot. Further improvement to the fin FET is still undergoing in the art.

SUMMARY OF THE INVENTION

Accordingly, the invention is directed to an electronic circuit formed with a plurality of fin FETs and a method for fabricating the electronic circuit of fin FET.

In an embodiment of the invention, an electronic circuit includes a plurality of fin lines on a substrate; and a plurality of gate lines with a first line width, crossing over the fin lines. The gate lines are parallel and have a plurality of discontinuous regions forming as a plurality of slots. A region of any one of the gate lines adjacent to an unbalance of the slots has a second line width smaller than the first line width.

In an embodiment of the invention, a method for fabricating an electronic circuit is also provided. The method includes: forming a plurality of fin lines on a substrate; forming a plurality of gate lines with a first line width, crossing over the fin lines, wherein the gate lines are parallel and have a plurality of discontinuous regions forming as a plurality of slots; and reducing the first line width into a second line width for a region of any one of the gate lines where the region is adjacent to an unbalance of the slots.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
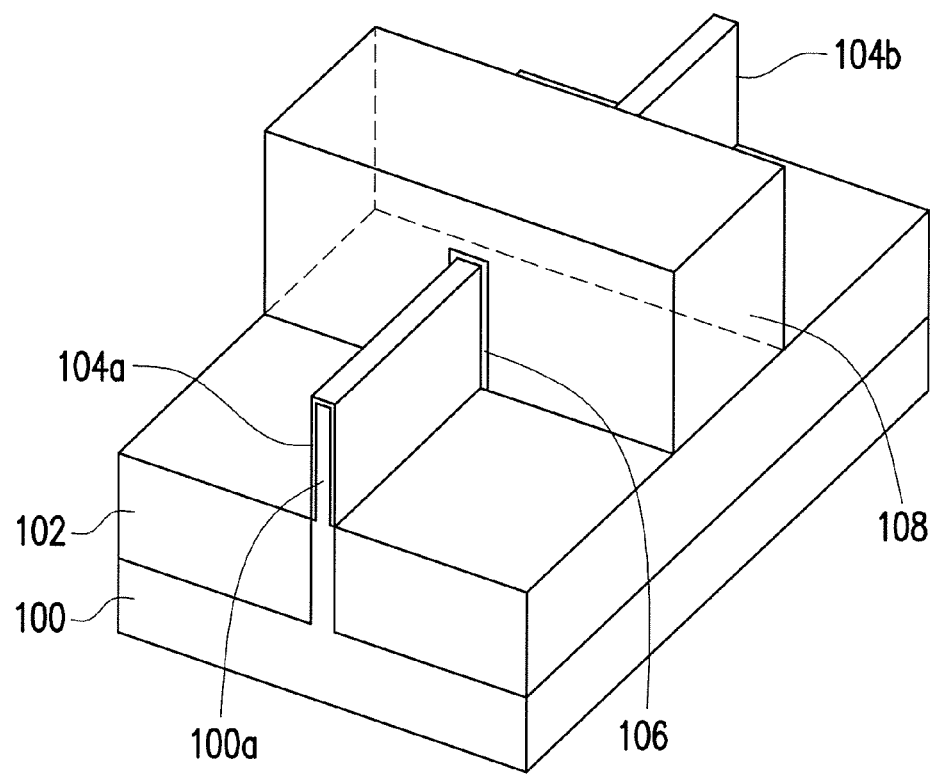
FIG. 1 is a drawing, schematically illustrating a perspective view of structure of a fin FET, according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

The invention is directed to an electronic circuit, which is formed from multiple fin FETs, such as a static random access memory (SRAM) formed from fin FETs. Here, the electronic device of fin FET SRAM is just an example and is not for limiting various applications of present invention.

To reduce the size of FET, the fin FET has been proposed to significantly reduce a FET size. The electronic circuit then usually made from multiple fin FETs, which in view of locations can be treated as a fin FET array. The circuit has multiple fin lines on a substrate and multiple gate lines with a first line width crossing over the fin lines. The gate lines are parallel and have a plurality of discontinuous regions forming as a plurality of slots. A region of any one of the gate lines has a second line width small than the first line with, when an unbalance of the slots neighboring to the region exits.

In structure, the inter-dielectric layer, such as oxide layer, is disposed between the gate lines and also fills the slot. The inter dielectric layer in fabrication may cause an unbalance stress to the gate line when the slot neighboring to the gate line exits at one side. The stress causes the distortion of the gate line toward to the neighboring slot. A circuit short may occur when the later conductive structure is formed over the slot.

The reduced line width as proposed in the invention can reduce the unbalance stress induced by the-inter dielectric layer, such as oxide layer, between the gate lines and the slots. The gate lines in an example are polysilicon lines.

To describe the issues investigated in the invention and the solution proposed by the invention in better understanding, several embodiments are provided for descriptions but not for limiting the scope of the invention.

FIG. 1 is a drawing, schematically illustrating a perspective view of structure of a fin FET, according to an embodiment of the invention. Referring to FIG. 1, a structure of a fin FET device is also taking the substrate 100 as the base. The substrate 100 can be silicon substrate in an example. On the substrate 100, a semiconductor fabrication process is first taken to form a fin structure 100a, which is a protruding structure from the substrate 100. An inter-dielectric layer 102 may be further formed on the substrate 100 and cover a lower portion of the fin structure 100a. The fin structure 100a is rather thin and looks like a fin structure 100a in 3D structure. The fin structure 100a actually is a top structure of the substrate 100 and has the same material as the substrate 100, such as silicon. The fin FET is to be formed on the fin structure 100a, so a gate insulating layer 106 is formed on surface of the fin structure 100a.

Here, depending on the actual design the gate insulating layer 106 may further include a portion extending to other part of the fin FETs, such as inter-dielectric 102, not explicitly shown in FIG. 1. However, at least a portion of the gate insulating layer 106, as shown, is formed on the surface of the fin structure 100a. The gate structure is also formed over the substrate 100 and covers the gate insulating layer 106 on the fin structure 100a. The gate structure is usually a line structure, so can be generally called as a gate line 108 in this disclosure. In structure, the gate line 108 would cross over the fin structure 100a and cover the gate insulating layer 106. The portion of the fin structure 100a at both sides of the gate line 108 not covered by the gate line 108 would respectively form as the source/drain regions 104a, 104b by implantation process. As a result, a single one of fine FET can be generally formed.

Figure 2:
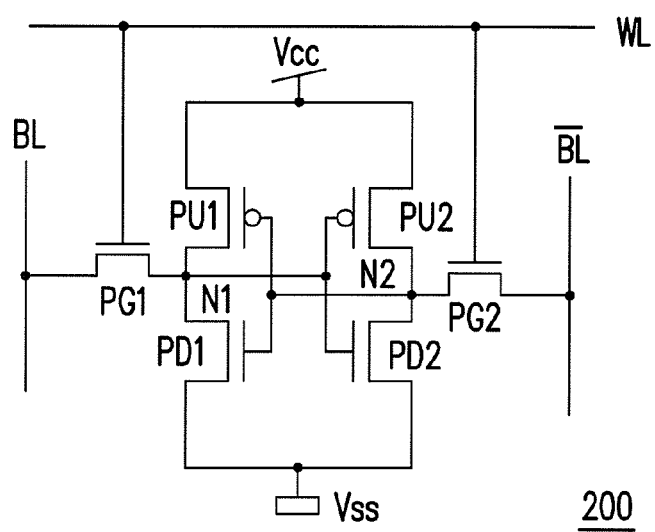
FIG. 2 is a drawing, schematically illustrating an electronic circuit of random access memory formed from multiple fin FETs, according to an embodiment of the invention.

In the actual circuit, many fin FETs are densely formed together, so many fin structure 100a can form a structure like the fin. FIG. 2 is a drawing, schematically illustrating an electronic circuit of random access memory formed from multiple fin FETs, according to an embodiment of the invention. Referring to FIG. 2, a memory cell of a random access memory (RAM), such as statistic RAM (SRAM), I circuit is illustrated as one of electronic circuit. However, in another embodiment, the invention is just limited to the SRAM and can be applied to other electronic circuit, which is formed from fin FETs. So, the electronic circuit shown in FIG. 2 is just an example for descriptions. The number of fin FETs in the embodiment is six in the example, of which the gates are respectively indicated by PU1, PU2, PD1, PD2, PG1, and PG2, in which the gates PU2 and PD2 is connected to the node N1 and the gates PU1 and PD1 are connected to the node N2. In addition, the world line WL, two complementary bit lines BL, $\overline{BL}$, the system power Vcc, and a system ground Vss are also included. The circuit itself can be understood by the one in ordinary skill in the art and is not further described in detail.

Figure 3:
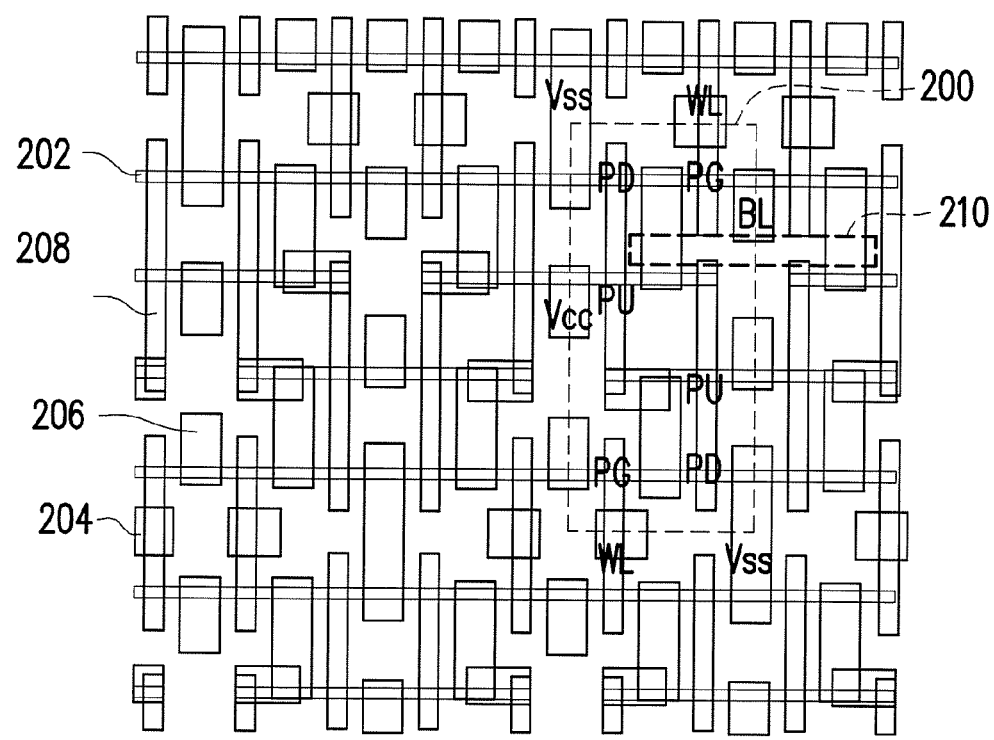
FIG. 3 a drawing, schematically a portion of layout for an electronic circuit in FIG. 2 formed from fin FETs, according to an embodiment of the invention.

FIG. 3 a drawing, schematically a portion of layout for an electronic circuit in FIG. 2 formed from fin FETs, according to an embodiment of the invention. Referring to FIG. 3, a unit of the electronic circuit shown in FIG. 2 can be formed in the circuit region 200. The electronic circuit generally in top view or a layout of circuit, a plurality of gate lines 208 with a first line width crossing over the fin lines, the first line width is referring to the general width for the gate lines 208 with further modification yet. The structure in detail for each gate line 208 can refer to the gate line 108 in FIG. 1. The gate lines 208 are parallel and have a plurality of discontinuous regions forming as a plurality of slots 210. A plurality of fin structures 202 in the electronic circuit is also arranged in parallel. Further as an example, the inter connection structure 206 as a part of bit line (BL) for connecting to the source/drain regions on the fin structure and the inter connection structure 204 as a part of word line (WL) for connecting to the gate line 208 are also formed for applying the operation voltages. The electronic circuit shown in FIG. 2 can then be formed in the circuit region 200. The other detail in fabrication is not further described.

Figure 4:
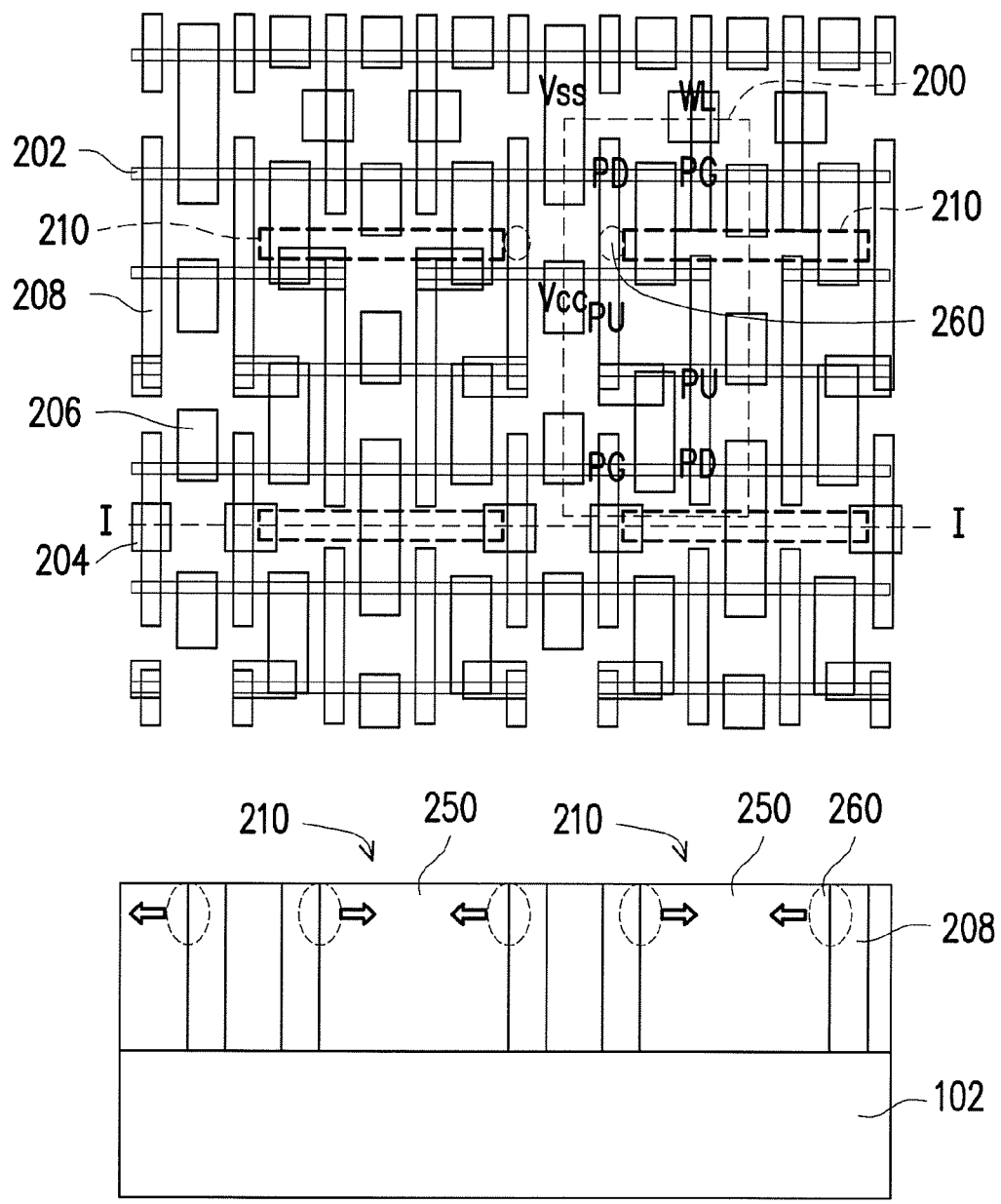
FIG. 4 is a drawing, schematically the layout in FIG. 3 and a cross-sectional structure along the cut line I-I, according to an embodiment of the invention.

The invention has investigated the effect caused by the slots 210 exiting in the gate lines 208 and found that at least a circuit-short issue may occur from the metal gate to the unintended nodes. FIG. 4 is a drawing, schematically the layout in FIG. 3 and a cross-sectional structure along the cut line I-I, according to an embodiment of the invention.

In detail, a region 260 of any one of the gate lines 208 adjacent to the slot 210 may just have a slot at one side, resulting in the unbalance stress applied on the gate line 208 at this specific region 260 and causing a distortion. Here, material of the gate line 208 in an example can be polysilicon. The detail is described in following example.

In the example in FIG. 4, many gate lines 208 are crossing over one of the fin structures 202 shown as fin lines. The cross-sectional structure cutting along the line I-I for the part of the gate lines is correspondingly shown at the lower drawing. The gate lines 208 in this cross-sectional structure are disposed on the inter-dielectric layer 102 in FIG. 1, as an example. It should be noted that the slots 210 are with respect to the gate lines 208. However, the slots 210 would be filled with inert-dielectric layer 250, such as silicon oxide. During this process of depositing the silicon oxide, due to the existing of the slots 210, the silicon oxide stress applied gate line 208 at this region 260 would cause the unbalance stress, shown by arrows. The unbalance stress on the gate line 208 would cause the distortion of the gate line 208 at the region 260, in which the serious distortion, when occurring, may cause a short circuit as not intended to the conductive layer, such as node layer, formed later over the slot 210.

After investigation the issue in the electronic circuit, such as the circuit shown in FIG. 2, FIG. 3, and FIG. 4, the invention provides an electron circuit, in which the lined width of the gate line is properly adjusted. The region 260 of any one of the gate lines 208 adjacent to an unbalance of the slots 210 has a second line width smaller than the first line width, which is a general line width as previous addressed.

Figure 5:
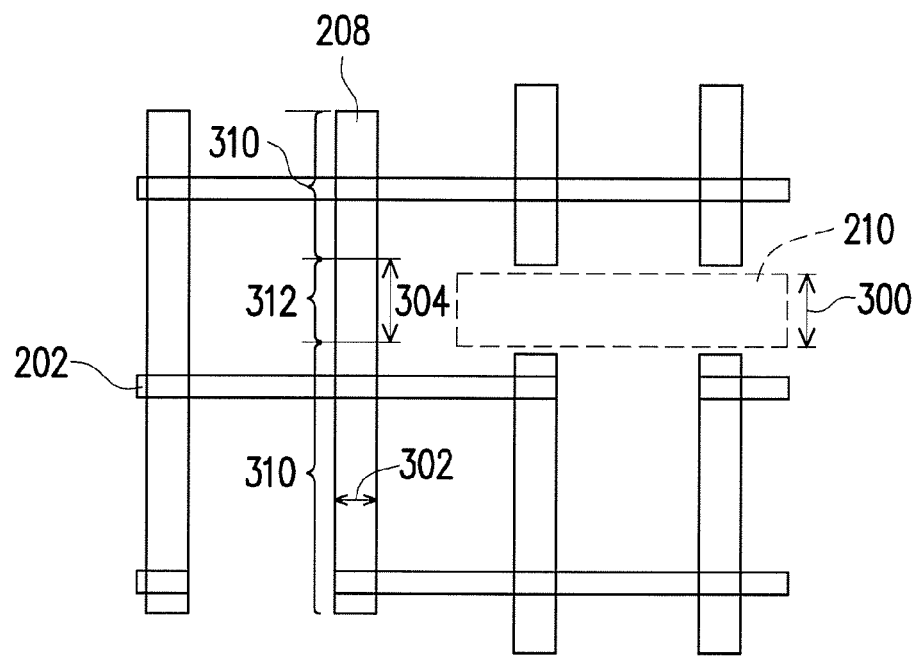
FIG. 5 is a drawing, schematically illustrating parameters defined based on the layout of an electronic circuit, according to an embodiment of the invention.

FIG. 5 is a drawing, schematically illustrating parameters defined based on the layout of an electronic circuit, according to an embodiment of the invention. Referring to FIG. 5, one of the gate lines 208 may include a region 310 and a region 312. The region 312, like the region 260 shown in FIG. 4, is corresponding to the unbalance slot 210, which just exits at one side of the gate line 208. The region 310 is the usually region of the gate line 208 other than the region 312. As to the size and location of the slots 210, any one of the gate lines 208 having discontinuous regions would have the slots 210, in which the width 300 of the slot 210 may be in a range of 10-60 nm as an example. The region 312 of the gate line 208 is corresponding to the slot 210 and may have the length 304 about equal to the width 300 of slot 210; however, it is not necessary to be about equal. Generally, the region 312 with the length 304 can be defined with proper conditions adjacent to the slot 210, where the unbalance stress on the gate line needs to be reduced. In an example, the region 312 has the length 304 in a range of 90%-110% of the slot width 300 of a corresponding one of the gate lines 208. The slot width 300 is in a range of 10-60 nm in an example.

Figure 6:
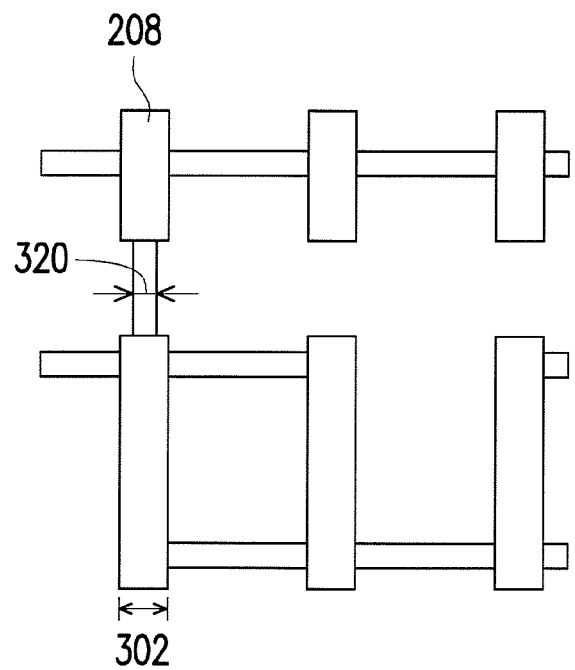
FIG. 6 is a drawing, schematically illustrating a structure of line width for gate line in an electronic circuit, according to an embodiment of the invention.

FIG. 6 is a drawing, schematically illustrating a structure of line width for gate line in an electronic circuit, according to an embodiment of the invention. Referring to FIG. 6 with FIG. 5, the gate line 208 at the region 310 generally has the first line width 302. To reduce the stress effect on the gate line at the region 312, the gate line 208 at the region 312 with the length 304 has a second line width 320, which is smaller than the first line width 302, so the gate line 208 at the region 312 experiences less stress due to silicon oxide is deposited. The distortion of gate line 208 can be reduced.

In detail about the dimension of the line width 320 in the embodiments, a ratio of the second line width 320 to the first line width 302 can be in a range of 0.5 to 0.9, or preferably in a range of 0.58 to 0.8.

Figure 7:
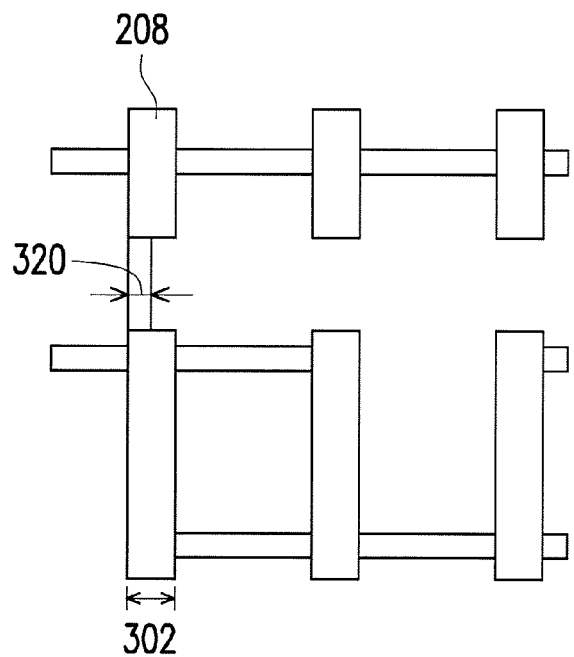
FIG. 7 is a drawing, schematically illustrating a structure of line width for gate line in an electronic circuit, according to an embodiment of the invention.
Figure 8:
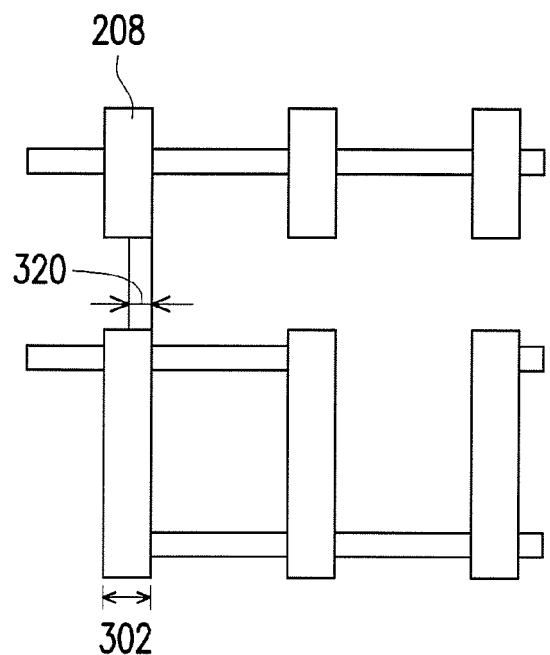
FIG. 8 is a drawing, schematically illustrating a structure of line width for gate line in an electronic circuit, according to an embodiment of the invention.

Further, the region 312 with the second line width 320 of a corresponding one of the gate lines 208 has one indent line edge just from one side or two indent line edges from both sides. The modifications from FIG. 6 are shown in FIG. 7 and FIG. 8. FIG. 7 and FIG. 8 are drawings, schematically illustrating a structure of line width for gate line in an electronic circuit, according to an embodiment of the invention. Referring to FIG. 6, two line edges of the gate line 208 at the region 312 are reduced to have the second line width 320. Referring to FIG. 7 or FIG. 8, instead, one line edge of the gate line 208 at the region 312 is reduced as the indent line edge to have the second line width 320.

Figure 9:
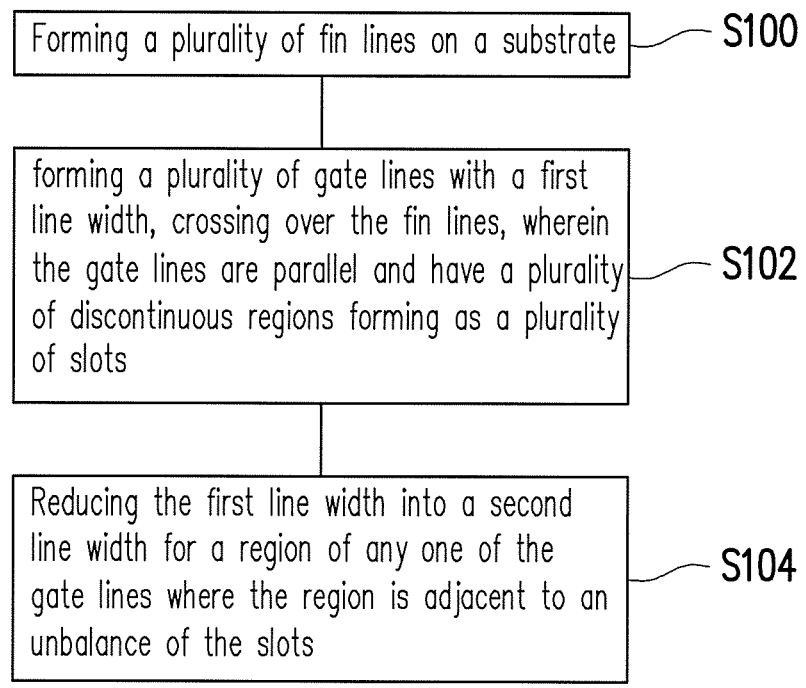
FIG. 9 is a drawing, schematically illustrating processes of a method for fabricating an electronic circuit, according to an embodiment of the invention.

Further alternatively, the invention also provides a method for fabricating an electronic circuit. FIG. 9 is a drawing, schematically illustrating processes of a method for fabricating an electronic circuit, according to an embodiment of the invention. Referring to FIG. 9, the method includes forming a plurality of fin lines on a substrate (S100); forming a plurality of gate lines with a first line width, crossing over the fin lines, wherein the gate lines are parallel and have a plurality of discontinuous regions forming as a plurality of slots (S102); and reducing the first line width into a second line width for a region of any one of the gate lines where the region is adjacent to an unbalance of the slots (S104).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic circuit, comprising:
a plurality of fin lines on a substrate; and
a plurality of gate lines with a first line width, crossing over the fin lines,
wherein the gate lines are parallel and have a plurality of discontinuous regions forming as a plurality of slots,
wherein a region of any one of the gate lines adjacent to an unbalance of the slots has a second line width smaller than the first line width.

2. The electronic circuit of claim 1, wherein the unbalance of the slots is a slot pattern, which just has one of the slots neighbouring to the region of the one of the gate lines.

3. The electronic circuit of claim 1, wherein the electronic circuit comprises a fin field effect transistor (FinFET) static random access memory (SRAM).

4. The electronic circuit of claim 1, wherein a ratio of the second line width to the first line width is in a range of 0.5 to 0.9.

5. The electronic circuit of claim 1, wherein a ratio of the second line width to the first line width is in a range of 0.58 to 0.8.

6. The electronic circuit of claim 1, wherein the region with the second line width of a corresponding one of the gate lines has one indent line edge just from one side or two indent line edges from both sides.

7. The electronic circuit of claim 1, wherein the slots have a slot width in a direction of the gate line by a range of 10 nm to 60 nm.

8. The electronic circuit of claim 1, wherein the region has a length in a range of 90%-110% of a slot width of a corresponding one of the gate lines.

9. The electronic circuit of claim 1, wherein the gate lines are polysilicon lines.

10. The electronic circuit of claim 1, further comprising an inter-dielectric layer, disposed between the gate lines and also filling the slots.

11. The electronic circuit of claim 1, further comprising a conductive structure over the slots.

12. A method for fabricating an electronic circuit, comprising:
forming a plurality of fin lines on a substrate;
forming a plurality of gate lines with a first line width, crossing over the fin lines, wherein the gate lines are parallel and have a plurality of discontinuous regions forming as a plurality of slots; and
reducing the first line width into a second line width for a region of any one of the gate lines where the region is adjacent to an unbalance of the slots.

13. The electronic circuit of claim 12, wherein the unbalance of the slots is a slot pattern, which just has one of the slots neighbouring to the region of the one of the gate lines.

14. The electronic circuit of claim 12, wherein the electronic circuit comprises a fin field effect transistor (Fin FET) static random access memory (SRAM).

15. The electronic circuit of claim 12, wherein a ratio of the second line width to the first line width is in a range of 0.5 to 0.9.

16. The electronic circuit of claim 12, wherein the region with the second line width of a corresponding one of the gate lines has one indent line edge just from one side or two indent line edges from both sides.

17. The electronic circuit of claim 12, wherein the slots have a slot width in a direction of the gate line by a range of 10 nm to 60 nm.

18. The electronic circuit of claim 12, wherein the region has a length in a range of 90%-110% of a slot width of a corresponding one of the gate lines.

19. The electronic circuit of claim 12, wherein the gate lines are formed by polysilicon lines.

20. The electronic circuit of claim 12, further forming an oxide layer between the gate lines and also in the slots.

* * * * *